(12) United States Patent
Umetsu et al.

(10) Patent No.: US 8,820,179 B2
(45) Date of Patent: Sep. 2, 2014

(54) PRESSING FORCE INPUT DEVICE

(71) Applicant: Alps Electric Co., Ltd., Tokyo (JP)

(72) Inventors: Eiji Umetsu, Tokyo (JP); Masahiko Ishizone, Tokyo (JP); Yukihiro Gorai, Tokyo (JP); Motoki Hirayama, Tokyo (JP); Hideki Gochou, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 13/692,381

(22) Filed: Dec. 3, 2012

(65) Prior Publication Data

US 2013/0104669 A1    May 2, 2013

Related U.S. Application Data

(63) Continuation of application No. PCT/JP2011/062997, filed on Jun. 7, 2011.

(30) Foreign Application Priority Data

Jun. 9, 2010    (JP) .................................. 2010-132147

(51) Int. Cl.
    *G01D 7/00*    (2006.01)
(52) U.S. Cl.
    USPC .................................................. 73/862.041
(58) Field of Classification Search
    USPC .................................................. 73/862.041
    See application file for complete search history.

(56) References Cited

U.S. PATENT DOCUMENTS 6,573,464 B2 *  6/2003  Yen ............................... 200/6 A
7,343,223 B2 *  3/2008  Miura et al. .................. 700/258

FOREIGN PATENT DOCUMENTS

JP    07-230353    8/1995
JP    09-167026    6/1997
JP    2006-10457    1/2006

OTHER PUBLICATIONS

International Search Report for PCT/JP2011/062997 mailed Sep. 13, 2011.

* cited by examiner

*Primary Examiner* — Lisa Caputo
*Assistant Examiner* — Octavia D. Hollington
(74) *Attorney, Agent, or Firm* — Hunton & Williams LLP

(57) ABSTRACT

An operation body is oscillatably supported by a fulcrum member. One side of the operation body is in contact with a projection of an actuator of a pressing force sensor, and a preload is applied to another side of the operation body by a compression coil spring as a preloading elastic member. By the preload, a detection output of the pressing force sensor is set at a neutral point. An operating force by which the one side of the operation body is pressed and an operating force by which the other side of the operation body is pressed can be distinctly detected with the single pressing force sensor.

4 Claims, 6 Drawing Sheets

PRESSING FORCE INPUT DEVICE

CLAIM OF PRIORITY

This application is a Continuation of International Application No. PCT/JP2011/062997 filed on Jun. 7, 2011, which claims benefit of Japanese Patent Application No. 2010-132147 filed on Jun. 9, 2010. The entire contents of each application noted above are incorporated herein by reference.

BACKGROUND OF THE DISCLOSURE

1. Field of the Disclosure

The present disclosure relates to a pressing force input device that can distinctly detect operations of different directions with a single pressing force sensor.

2. Description of the Related Art

A pressing force sensor that obtains detection output proportional to a pressing force has been used in various input devices.

In a pressing force input device disclosed in Japanese Unexamined Patent Application Publication No. 2006-10457, a pressure sensor, which is a pressing force sensor, is in contact with a back surface of a center portion of a rectangular touch panel. The touch panel is provided with a projection along the entire periphery thereof, and the projection is pressed against a back surface of a support means by the force of a spring. When the touch panel is pressed at an arbitrary position, the touch panel is tilted about a contact portion between the projection and the support means which portion is located on the side of the pressure sensor opposite to the pressed point, whereby a pressing operation is performed on the pressure sensor.

In the above embodiment, even when any position of the rectangular touch panel is pressed, the pressing force can be detected with the pressure sensor.

As described in Japanese Unexamined Patent Application Publication No. 2006-10457, the existing pressing force input device employing the pressing force sensor (pressure sensor) can detect a change of a pressing force in one direction or a change of a pressing stroke in one direction with the single pressing force sensor, but cannot distinctly detect operation forces of different directions with the single pressing force sensor.

Therefore, in order to distinctly detect operations of different directions, two or more pressing force sensors are required. Thus, the device is increased in size and the cost of the device is also increased.

These and other drawbacks exist.

SUMMARY OF THE DISCLOSURE

The present disclosure solves the above-described problem of the related art and provides a pressing force input device that can distinctly detect operations of different directions with a common pressing force sensor.

The present disclosure provides a pressing force input device including: a pressing force sensor including an actuator and a detection portion whose output changes when the actuator is pressed; and an operation body configured to cause the pressing force sensor to operate. The operation body is pressed against the actuator by an elastic member, the detection portion is set at a neutral point between a starting point and an end point of a detection operation range thereof, and a detection output showing changes in different directions across the neutral point when the operation body is operated toward one direction and when the operation body is operated toward another direction is obtained from the detection portion.

In the present disclosure, the pressing force sensor may be a force sensor or a pressure sensor from which a detection output corresponding to a change of a force when the actuator is pressed is obtained. In the present disclosure, the pressing force sensor is not limited to one detecting a change of a force applied to the actuator, and may be, for example, one from which a detection output proportional to a pressing stroke of the actuator is obtained.

In the present disclosure, the operation body may be oscillatably supported via a fulcrum, the operation body may be in contact with the actuator at one side thereof with respect to the fulcrum, the elastic member configured to press the operation body against the actuator may be provided to another side of the operation body with respect to the fulcrum, and a detection output showing changes in different directions across the neutral point when the operation body is pressed at the one side thereof with respect to the fulcrum and when the operation body is pressed at the other side thereof with respect to the fulcrum may be obtained from the detection portion.

Also, in the present disclosure, the operation body may be oscillatably supported via a fulcrum, the operation body may be in contact with the actuator at one side thereof with respect to the fulcrum, the elastic member configured to press the operation body against the actuator may be provided to the same side, and a detection output showing changes in different directions across the neutral point when the operation body is pressed at the one side thereof with respect to the fulcrum and when the operation body is pressed at the other side thereof with respect to the fulcrum may be obtained from the detection portion.

The pressing force input device according to the various embodiments disclosed herein uses a pressing force sensor which obtains a detection output corresponding to a change of a pressing force or a change of a pressing stroke, and can distinctly detect operating forces or operation strokes of different directions with the single pressing force sensor. Thus, the number of used pressing force sensors can be reduced.

DETAILED DESCRIPTION OF THE DISCLOSURE

The following description is intended to convey a thorough understanding of the embodiments described by providing a number of specific embodiments and details involving a pressing force input device. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Figure 1:
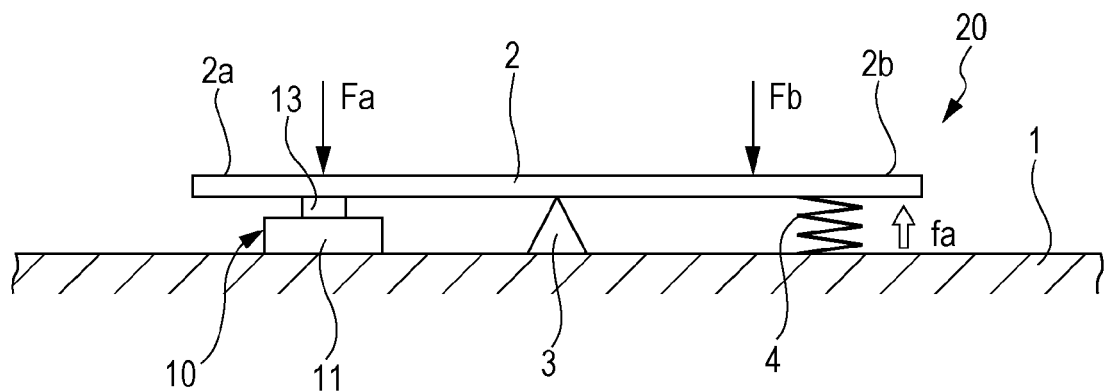
FIG. 1 is a side view of a pressing force input device according to an exemplary embodiment of the present disclosure.

In a pressing force input device 20 shown in FIG. 1, an operation body 2 may be provided above a base 1. The operation body 2 may be oscillatably supported at a central portion thereof by a fulcrum member 3. The fulcrum member 3 may be, for example, a support shaft which rotatably supports the operation body 2, a torsion bar which may be fixed to the central portion of the operation body 2 and can deform in an oscillatory manner, or a plate spring which supports the central portion of the operation body 2. A pressing force sensor 10 may be provided between the base 1 and one side 2a of the operation body 2 with respect to the fulcrum member 3.

Figure 3:
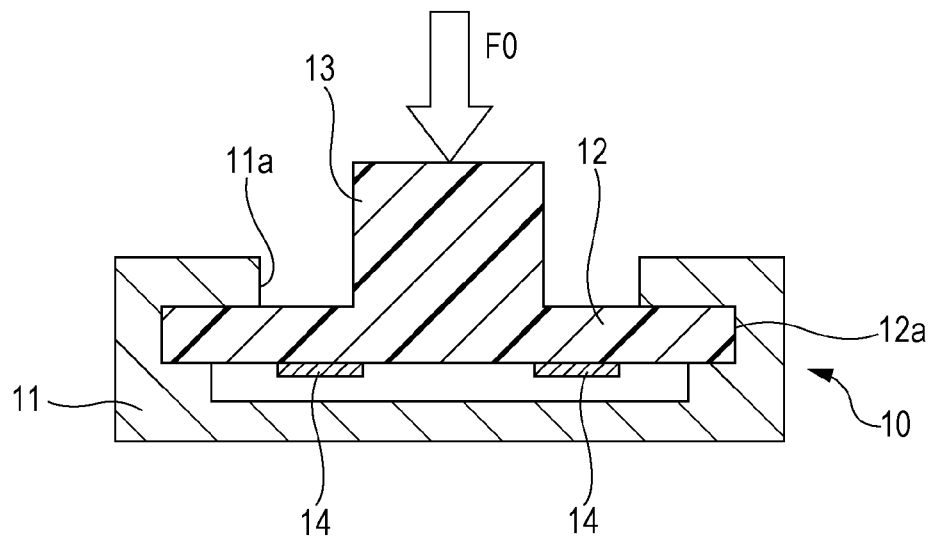
FIG. 3 is a cross-sectional view of a pressing force sensor.

As shown in FIG. 3, in the pressing force sensor 10, an actuator 12 may be provided within a housing 11. The actuator 12 may be formed from a flexurally-deformable material such as silicon into a disc shape, and an outer circumferential portion 12a thereof may be fixed to the housing 11. A projection 13 may be integrally formed at a central portion of the actuator 12 and may protrude from an opening 11a of the housing 11.

Figure 4:
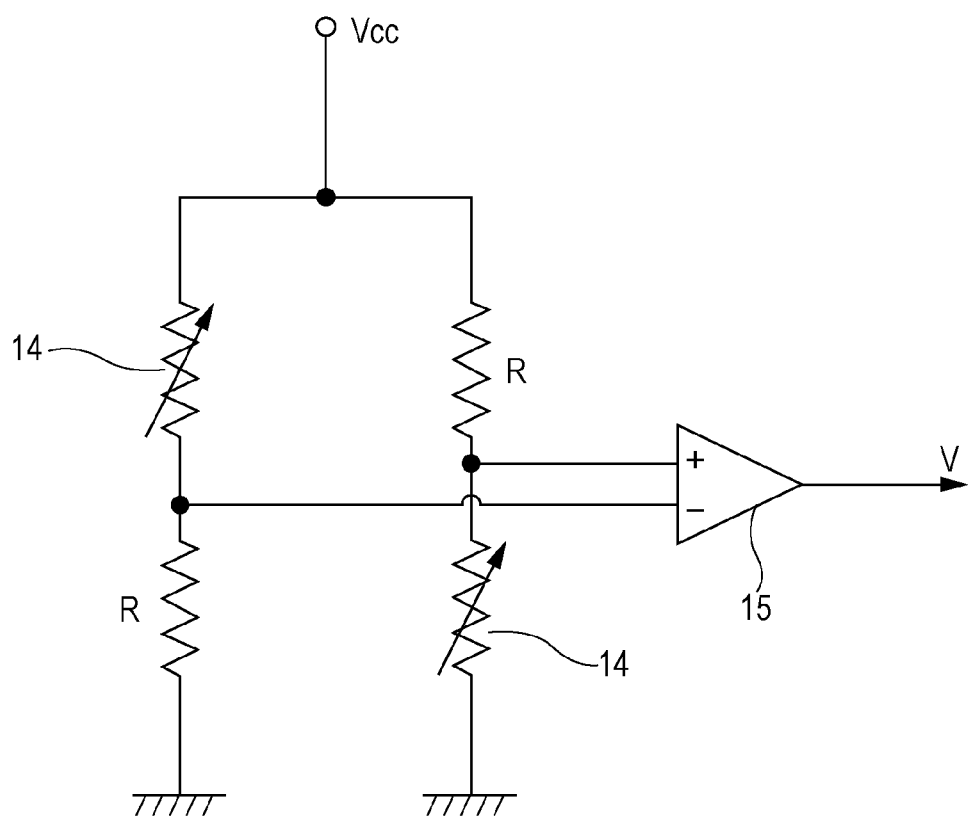
FIG. 4 is a circuit diagram showing a detection circuit of an exemplary pressing force sensor.

A strain gauge 14 may be fixed as a detection portion to a lower surface of the actuator 12. FIG. 4 shows an example of a detection circuit accompanying the pressing force sensor 10. FIG. 4 shows an example where two strain gauges 14 exhibiting the same characteristic with respect to strain of the actuator 12 are provided. The number of strain gauges 14 may be one, or three or more.

In the detection circuit shown in FIG. 4, each strain gauge 14 and each fixed resistor R may be connected in series to form two serial portions. In one of the serial portions, the fixed resistor R side may be grounded, and a voltage vcc may be applied to the strain gauge 14 side. In the other serial portion, the strain gauge 14 side may be grounded, and the voltage vcc may be applied to the fixed resistor R side. A midpoint potential between the strain gauge 14 and the fixed resistor R of each serial portion may be applied to a differential amplifier 15, and an output voltage V may be obtained as a detection output from the differential amplifier 15.

Figure 5:
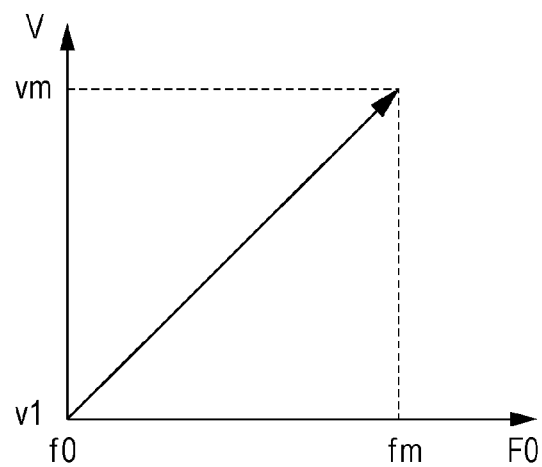
FIG. 5 is a diagram showing a characteristic of a detection output of an exemplary pressing force sensor.

A change of the output voltage V when a pressing force F0 directed toward the housing 11 is applied to the projection 13 of the pressing force sensor 10 as shown in FIG. 3 is shown in a diagram of FIG. 5.

When the projection 13 is pressed by the pressing force F0, the disc-shaped actuator 12 deforms such that its central portion has a downwardly convex shape, each strain gauge 14 stretches, and their resistance values may increase. Therefore, the output voltage V may increase as the pressing force F0 increases.

When the range of the force F0 applied to the pressing force sensor 10 is f0 to fm (the force is zero at f0) as shown in FIG. 5, the output voltage V continuously may increase from v1 to vm in this detection operation range. When the force F0 is decreased from fm, the strain is eliminated by the own elastic force of the actuator 12 and the output voltage V may decrease from vm to v1.

It is noted that in FIG. 5, the output voltage V changes as a linear function in response to change of the force F0, but the output voltage V may change in a curved manner in response to change of the force F0.

In the pressing force input device 20 shown in FIG. 1, a compression coil spring 4 may be interposed as a preloading elastic member between the base 1 and another side 2b of the operation body 2 with respect to the fulcrum member 3, and an upward preload fa may be applied from the compression coil spring 4 to the other side 2b of the operation body 2. By the preload fa, the operation body 2 may be counterclockwise urged with a support point of the fulcrum member 3 as a fulcrum, and the projection 13 of the pressing force sensor 10 may be pressed by the one side 2a of the operation body 2.

Figure 6A:
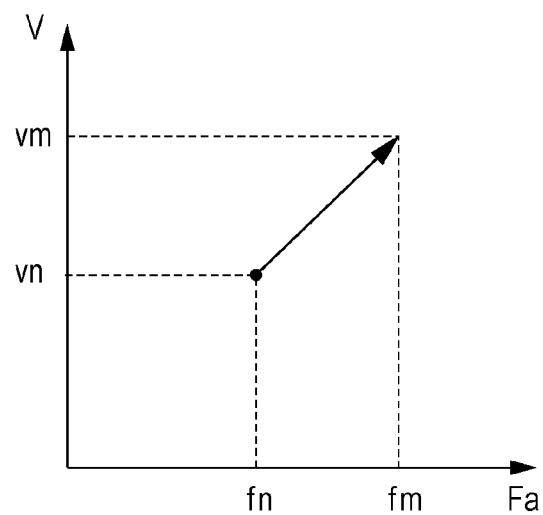
FIGS. 6A and 6B are diagrams showing detection outputs of a pressing force sensor when operating forces of different directions are applied to an operation body.
Figure 6B:
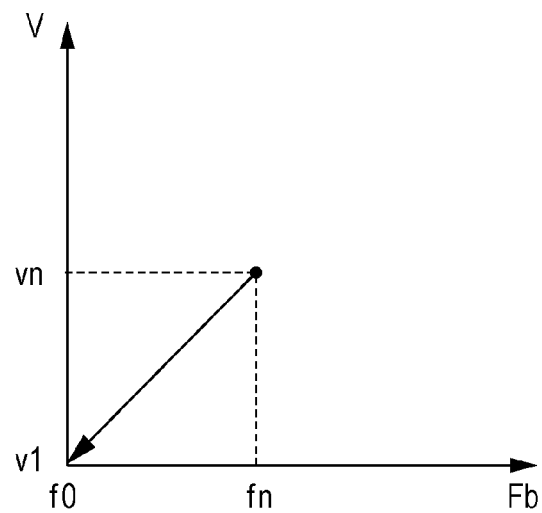

As a result, as shown in FIGS. 6A and 6B, when no external force is applied to the operation body 2, the pressing force F0 applied to the projection 13 of the pressing force sensor 10 may be set to a neutral point fn between the starting point f0 and the end point fm of the detection operation range by the preload fa, and the output voltage V may be set to a neutral point vn between the starting point v1 and the end point vm of the detection operation range by the preload fa. The neutral point vn may be a point of ½ between the starting point v1 and the end point vm of the detection operation range, but is not necessarily limited to the point of ½.

In the pressing force input device 20 shown in FIG. 1, the output voltage V of the pressing force sensor 10 when no external force may be applied to the operation body 2 is at the neutral point vn.

When the one side 2a of the operation body 2 is pressed by the operating force Fa as shown in FIG. 1, the pressing force F0 applied to the projection 13 may increase from the neutral point fn toward fm as shown in FIG. 6A, and the output voltage V gradually may increase from the neutral point vn toward the end point vm. When the operating force Fa applied to the side 2a of the operation body 2 is gradually decreased, the output voltage V may decrease from the end point vm toward the neutral point vn.

When the other side 2b of the operation body 2 is pressed by the operating force Fb, the pressing force applied to the projection 13 may decrease from the neutral point fn toward f0 as shown in FIG. 6B, and the output voltage V may decrease from the neutral point vn toward the starting point v1.

In the pressing force input device 20 shown in FIG. 1, the output voltage V of the single pressing force sensor 10 may show changes in different directions across the neutral point vn when the operating force Fa is applied to the side 2a of the operation body 2 and when the operating force Fb is applied to the other side 2b of the operation body 2. Thus, both the operating force Fa and the operating force Fb can be detected with the single pressing force sensor 10. In addition, a change of the magnitude of the operating force Fa and a change of the magnitude of the operating force Fb can be distinctly detected.

In addition, even in a state where the projection 13 of the actuator 12 and the operation body 2 are merely in contact with each other, when the other side 2b of the operation body 2 is pressed by the operating force Fb, the projection 13 can return to its initial state by the elastic restoring force of the actuator 12. Thus, it is not necessary to bond the projection 13 of the pressing force sensor 10 to the lower surface of the operation body 2, and it is not necessary to worry about separation of the projection 13 and the operation body 2.

In the embodiment shown in FIG. 1, the housing 11 of the pressing force sensor 10 may be fixed to the base 1, and the projection 13 may be pressed at the lower surface of the one side 2a of the operation body 2. Meanwhile, in a modified example shown in FIG. 2, the housing 11 of the pressing force sensor 10 may be fixed to the lower surface of the one side 2a of the operation body 2, and the projection 13 may be pressed against the base 1. In the modified example shown in FIG. 2 as well, the compression coil spring 4 is provided as a preloading elastic member, and output change may be the same as in the embodiment shown in FIG. 1.

Figure 7:
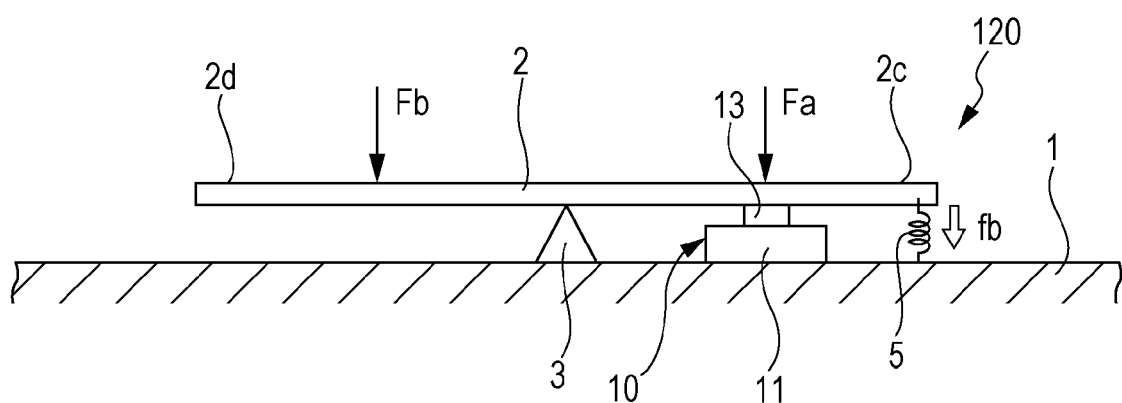
FIG. 7 is a side view of a pressing force input device according to an exemplary embodiment of the present disclosure.

In a pressing force input device 120 according to an embodiment shown in FIG. 7, the pressing force sensor 10 may be provided between the base 1 and one side 2c of the operation body 2 with respect to a support point by the fulcrum member 3. In the pressing force sensor 10, the housing 11 may be fixed to the base 1, and the projection 13 may be in contact with the one side 2c of the operation body 2.

An extension coil spring 5 may be mounted as a preloading elastic member between the base 1 and the one side 2c of the operation body 2, and a preload fb to draw the one side 2c of the operation body 2 toward the base 1 may be applied by the extension coil spring 5. By the preload fb, the one side 2c of the operation body 2 may be pressed against the projection 13 of the pressing force sensor 10, and the output voltage V of the pressing force sensor 10 may be set at the neutral point vn shown in FIGS. 6A and 6B when no external force is applied to the operation body 2.

When the one side 2c of the operation body 2 is pressed by an operating force Fa as shown in FIG. 7, the output voltage V of the pressing force sensor 10 may change so as to increase from the neutral point vn toward the end point vm as shown in FIG. 6A. When another side 2d of the operation body 2 is pressed by an operating force Fb, the output voltage V of the pressing force sensor 10 changes so as to decrease from the neutral point vn toward the starting point v1 as shown in FIG. 6B.

The pressing force input device 120 shown in FIG. 7 also can distinctly detect the operating forces Fa and Fb which may be applied to the operation body 2 and have the directions different from each other, with the single pressing force sensor 10 on the basis of the output voltage which changes in different directions across the neutral point vn. In addition, the pressing force input device 120 can distinctly detect a change of the magnitude of the operating force Fa and a change of the magnitude of the operating force Fb.

In the pressing force input device 120 shown in FIG. 7, the pressing force sensor 10 and the extension coil spring 5 may be provided to the one side 2c of the operation body 2 and are not provided to the other side 2d of the operation body 2. Thus, flexibility in designing an operation surface of an electronic device can be increased such as locating the other side 2d of the operation body 2 at the periphery of an operation surface of a portable device.

Figure 2:
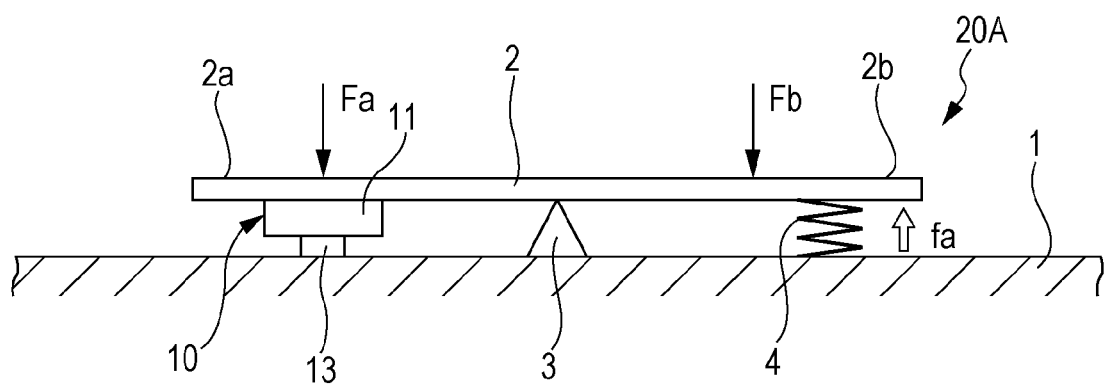
FIG. 2 is a side view showing a modified example of the pressing force input device according to an embodiment of the present disclosure.

In addition, in an embodiment shown in FIG. 7 as well, a structure may be provided in which the housing 11 of the pressing force sensor 10 may be fixed to the operation body 2 and the projection 13 may be in contact with the base 1 as shown in FIG. 2.

Figure 8A:
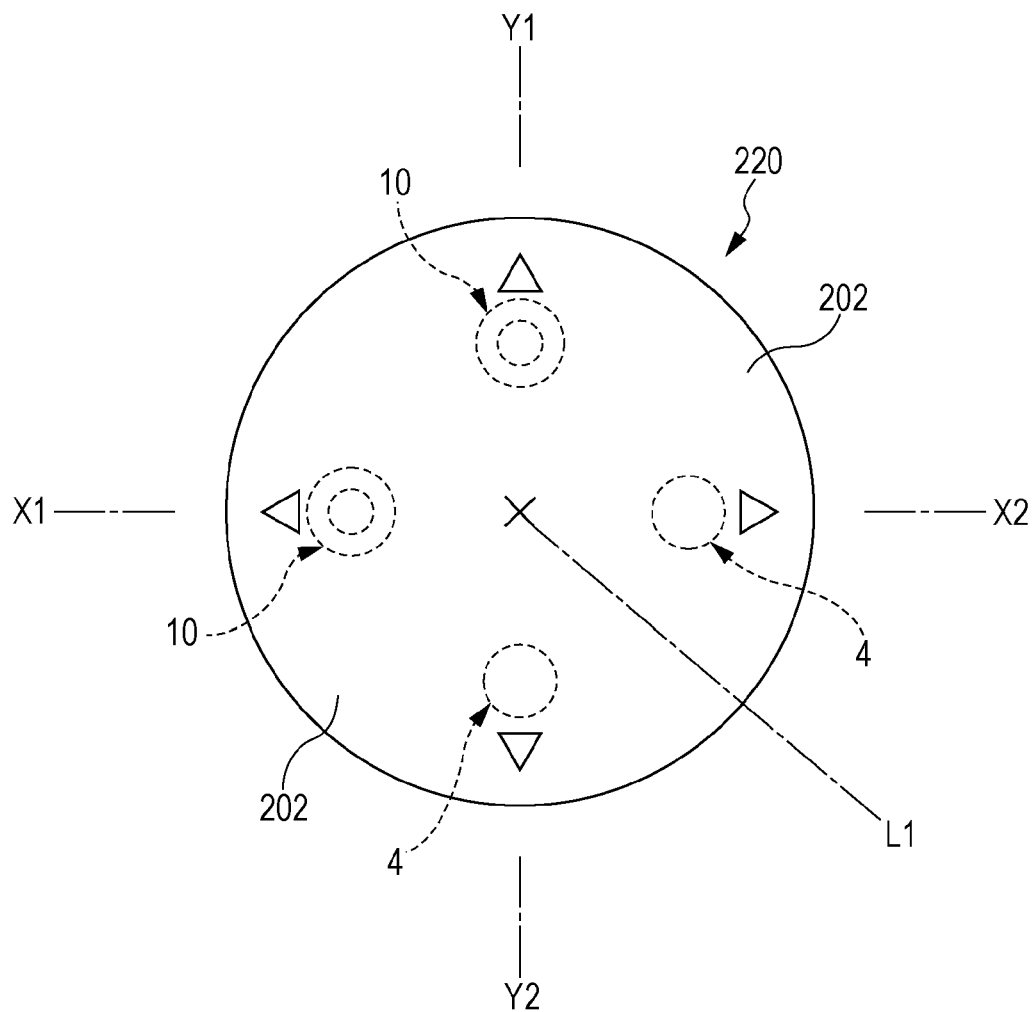
FIG. 8A is a plan view of a pressing force input device according to an exemplary embodiment of the present disclosure.
Figure 8B:
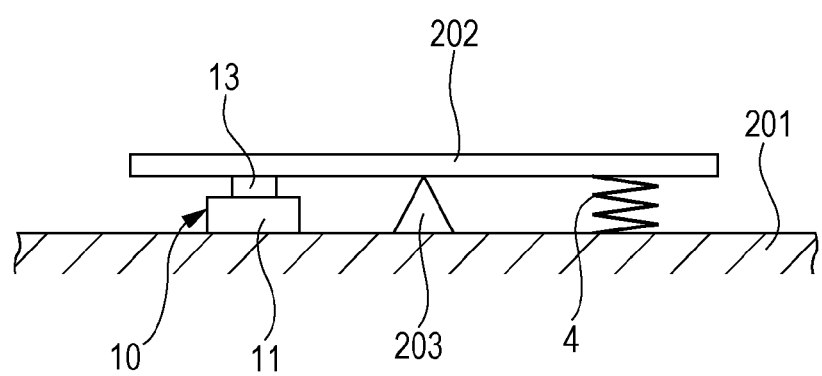
FIG. 8B is a side view of the pressing force input device according to an embodiment of the present disclosure.

A pressing force input device according to an embodiment of the present disclosure shown in FIG. 8 includes a circular operation body 202 into which an input in an X direction and an input in a Y direction can be made. The operation body 202 may be supported at a center thereof (the center of the drawing) by a fulcrum member 203.

Between the operation body 202 and a base 201, pressing force sensors 10 may be provided to an X1 side and a Y1 side, respectively. Compression coil springs 4 may be provided as preloading elastic members to an X2 side and a Y2 side, respectively. By preloads fa applied from the compression coil springs 4, the output voltages V of the two pressing force sensors 10 may be set at the neutral point vn.

When the X1 side of the operation body 202 is pressed, the output voltage V of the pressing force sensor 10 located on the X1 line may change as shown in FIG. 6A. When the X2 side of the operation body 202 is pressed, the output voltage V of the pressing force sensor 10 located on the X2 line may change as shown in FIG. 6A. When the Y1 side of the operation body 202 is pressed, the output voltage V of the pressing force sensor 10 located on the Y1 line may change as shown in FIG. 6B. When the Y2 side of the operation body 202 is pressed, the output voltage V of the pressing force sensor 10 located on the Y2 line may change as shown in FIG. 6B.

It is noted that the compression coil springs 4 may not be provided on the X2 line and the Y2 line, a single compression coil spring 4 may be located on a division center line L that divides the angle between the X2 line and the Y2 line into two equal angles, and a preload may be applied to the two pressing force sensors 10 by the single compression coil spring 4.

In addition, the pressing force input device 220 shown in FIG. 8 on which operations of four directions can be performed may have the structure shown in FIG. 7.

Figure 9:
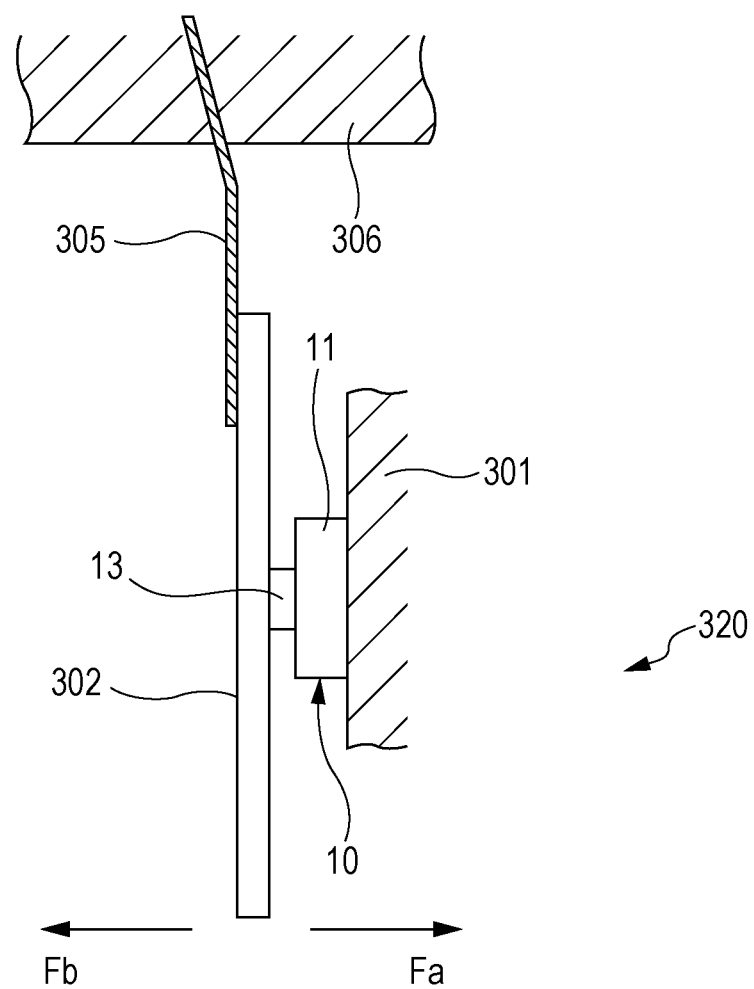
FIG. 9 is a side view of a pressing force input device according to an exemplary embodiment of the present disclosure.

In a pressing force input device 320 according to an embodiment shown in FIG. 9, the housing 11 of the pressing force sensor 10 may be fixed to a base 301. A plate spring 305 made of metal as a preloading elastic member may be fixed at one end thereof to a support portion 306, and an operation body 302 is fixed to the other end of the plate spring 305. By the elastic force of the plate spring 305, the operation body 302 may be pressed against the projection 13 of the pressing force sensor 10, and the output voltage V of the pressing force sensor 10 is set at the neutral point vn.

As shown in FIG. 9, when an operating force Fa of the right direction in the drawing is applied to the operation body 302, the output voltage V shown in FIG. 6A can be obtained, and when an operating force Fb of the left direction in the drawing is applied to the operation body 302, the output voltage V shown in FIG. 6B can be obtained.

The pressing force input device 320 can distinctly detect the operating forces Fa and Fb which may be applied to the operation body 302 and have directions different from each other, with the single pressing force sensor, and can also distinctly detect a change of the magnitude of the operating force Fa and a change of the magnitude of the operating force Fb.

The detection output of the pressing force sensor 10 of the above-described embodiment may change in response to a change of the magnitude of the operating force Fa applied to the projection 13 of the actuator 12 as shown in FIG. 3. However, the pressing force sensor 10 may detect a change of a stroke of an actuator, and an elastic storing force may be applied to the actuator. In this case, by a preload being applied from the operation body to the actuator, the actuator is set at a neutral point between the starting point and the end point of the stroke, and a detection output corresponding to the neutral point is set. When operating forces of different directions are applied to the operation body, detection outputs of different directions across the neutral point are obtained.

Accordingly, the embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. A pressing force input device comprising:
    a pressing force sensor including an actuator and a detection portion whose output changes when the actuator is pressed; and
    an operation body configured to cause the pressing force sensor to operate,
    wherein the operation body is pressed against the actuator by an elastic member, and a preload is thereby applied to the pressing force sensor,
    an output of the pressing force sensor when the operation body is not operated is set at a neutral point between a starting point and an end point in a detection operation range of the detection portion, and
    a detection output showing changes in different directions across the neutral point when the operation body is operated toward one direction and when the operation body is operated toward another direction is obtained from the detection portion.

2. The pressing force input device according to claim 1, wherein a detection output corresponding to a change of a force when the actuator is pressed is obtained from the detection portion.

3. The pressing force input device according to claim 1, wherein
    the operation body is oscillatably supported via a fulcrum,
    the operation body is in contact with the actuator at one side thereof with respect to the fulcrum,
    the elastic member configured to press the operation body against the actuator is provided to another side of the operation body with respect to the fulcrum, and
    a detection output showing changes in different directions across the neutral point when the operation body is pressed at the one side thereof with respect to the fulcrum and when the operation body is pressed at the other side thereof with respect to the fulcrum is obtained from the detection portion.

4. The pressing force input device according to claim 1, wherein
    the operation body is oscillatably supported via a fulcrum,
    the operation body is in contact with the actuator at one side thereof with respect to the fulcrum,
    the elastic member configured to press the operation body against the actuator is provided to the same side, and
    a detection output showing changes in different directions across the neutral point when the operation body is pressed at the one side thereof with respect to the fulcrum and when the operation body is pressed at the other side thereof with respect to the fulcrum is obtained from the detection portion.

* * * * *